(12) United States Patent
Tsai et al.

(10) Patent No.: US 10,244,666 B2
(45) Date of Patent: Mar. 26, 2019

(54) CONTROLLING IMPEDANCE OF BLANK CARTRIDGES

(71) Applicant: HEWLETT PACKARD ENTERPRISE DEVELOPMENT LP, Houston, TX (US)

(72) Inventors: Pinche Tsai, Richardson, TX (US); Kevin D Conn, Montgomery, TX (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 125 days.

(21) Appl. No.: 15/118,888

(22) PCT Filed: Feb. 14, 2014

(86) PCT No.: PCT/US2014/016545
§ 371 (c)(1),
(2) Date: Aug. 14, 2016

(87) PCT Pub. No.: WO2015/122914
PCT Pub. Date: Aug. 20, 2015

(65) Prior Publication Data
US 2017/0325363 A1 Nov. 9, 2017

(51) Int. Cl.
*G06F 1/20* (2006.01)
*H05K 7/20* (2006.01)
*G06F 1/18* (2006.01)

(52) U.S. Cl.
CPC ......... *H05K 7/20836* (2013.01); *G06F 1/185* (2013.01); *G06F 1/187* (2013.01);
(Continued)

(58) Field of Classification Search
CPC .......... H05K 7/20145; H05K 7/20281; H05K 7/20554–7/20581; H05K 7/207;
(Continued)

(56) References Cited

U.S. PATENT DOCUMENTS

| 4,399,485 A | 8/1983 | Wright |
| 4,894,749 A * | 1/1990 | Elko ........................ G06F 1/20 165/104.33 |

(Continued)

FOREIGN PATENT DOCUMENTS

| JP | 2009170649 | 7/2009 |
| JP | 2012049215 | 3/2012 |
| JP | 2013074219 | 4/2013 |

OTHER PUBLICATIONS

Dominick Lovicott, "Thermal Design of the Dell™ Poweredge™ T610™, R610™, and R710™ Servers," Jun. 11, 2009, <http://www.dell.com/downloads/global/products/pedge/en/server-poweredge-11g-thermal-design-en.pdf >.

(Continued)

*Primary Examiner* — Robert J Hoffberg
(74) *Attorney, Agent, or Firm* — Hewlett Packard Enterprise Patent Department

(57) ABSTRACT

A blank cartridge includes an impedance portion to control a flow of cooling media through the blank cartridge to a plurality of computing components, and an actuator to change an impedance level of the impedance portion. The actuator receives a control signal to change the impedance level of the impedance portion based on a location of the plurality of computing components relative to the blank cartridge.

15 Claims, 7 Drawing Sheets

(52) U.S. Cl.
CPC ............... *G06F 1/20* (2013.01); *H05K 7/20* (2013.01); *H05K 7/20145* (2013.01); *H05K 7/20727* (2013.01); *H05K 7/20772* (2013.01); *G06F 2200/201* (2013.01)

(58) Field of Classification Search
CPC ....... H05K 7/20718–7/20745; H05K 7/20836; G11B 33/1406; G11B 33/1413; G11B 33/144
See application file for complete search history.

(56) References Cited

U.S. PATENT DOCUMENTS

| | | | | |
|---|---|---|---|---|
| 6,309,295 B1 * | 10/2001 | Clarke | ............... | H05K 7/20563 361/695 |
| 6,785,133 B2 * | 8/2004 | Barringer | ............... | G06F 1/18 361/694 |
| 7,075,788 B2 * | 7/2006 | Larson | ............... | G06F 1/20 165/185 |
| 7,079,387 B2 * | 7/2006 | Brooks | ............... | G06F 1/20 165/185 |
| 7,139,170 B2 * | 11/2006 | Chikusa | ............... | G06F 1/20 361/695 |
| 7,269,006 B2 * | 9/2007 | Miyamoto | ............... | G11B 33/12 312/236 |
| 7,508,663 B2 * | 3/2009 | Coglitore | ............... | H05K 7/20736 165/122 |
| 7,554,803 B2 * | 6/2009 | Artman | ............... | H05K 7/20563 361/679.49 |
| 7,688,593 B2 * | 3/2010 | Byers | ............... | H05K 7/20572 165/104.33 |
| 7,755,889 B2 * | 7/2010 | Vinson | ............... | G06F 1/20 312/223.2 |
| 7,864,541 B2 * | 1/2011 | Lucero | ............... | G06F 1/20 361/679.51 |
| 8,248,793 B2 * | 8/2012 | Bash | ............... | H05K 7/20609 312/236 |
| 8,542,487 B2 * | 9/2013 | Kobayashi | ............... | H05K 7/20572 361/695 |
| 8,764,405 B2 * | 7/2014 | Mashak | ............... | F04D 27/001 361/679.5 |
| 8,767,399 B2 * | 7/2014 | Goto | ............... | H05K 7/20209 361/679.51 |
| 2005/0168945 A1 | 8/2005 | Coglitore | | |
| 2005/0241810 A1 | 11/2005 | Malone et al. | | |
| 2006/0039108 A1 | 2/2006 | Chikusa | | |
| 2006/0227505 A1 * | 10/2006 | Miyamoto | ............... | H05K 7/20572 361/695 |
| 2008/0291621 A1 | 11/2008 | Regimbal et al. | | |
| 2009/0016019 A1 * | 1/2009 | Bandholz | ............... | G06F 1/20 361/695 |
| 2013/0083481 A1 | 4/2013 | Goto et al. | | |

OTHER PUBLICATIONS

PCT/ISA/KR, International Search Report, dated Nov. 12, 2014, PCT/US2014/016545, 12 pps.

* cited by examiner

CONTROLLING IMPEDANCE OF BLANK CARTRIDGES

BACKGROUND

Networked computing systems generally include host computing devices to provide resources such as storage, applications, databases, and the like. The host computing device may be a server such as a database server, file server, mail server, print server, web server, or some other type of server to provide services to client devices within a network. A blade server is a server computer having a modular design optimized to minimize the use of physical space. Whereas a standard rack mount server can function with a power cord and network cable, a blade server has many components removed for the purposes of saving space, minimizing power consumption and other considerations, while still having all the functional components to be considered a computer. A multi-slot blade enclosure can hold multiple blade server cartridges and provide shared resources such as power, cooling, networking, various interconnects, and management. Each cartridge can function as a computer server to run one or more computing services.

BRIEF DESCRIPTION OF THE DRAWINGS

Some examples of the present application are described with respect to the following figures.

DETAILED DESCRIPTION

Figure 1:
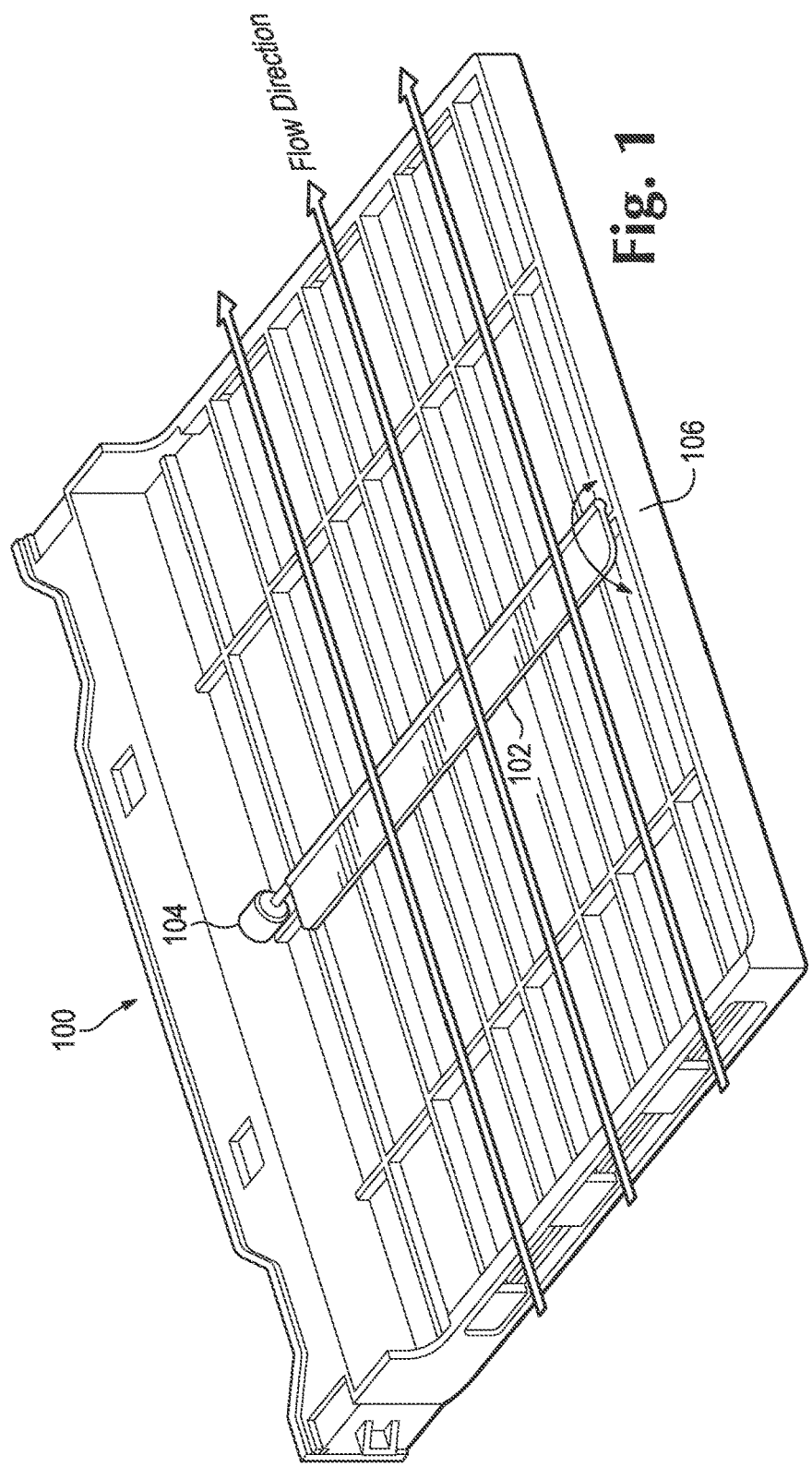
FIG. 1 illustrates an example of a blank cartridge including an impedance portion and an actuator to change an impedance level of the impedance portion.

Cooling media such as air, liquid, gas, and chemical compounds are commonly used to cool computer servers and other electronic equipment within an electronics enclosure. For example, fans powered by electric motors are commonly used to provide air cooling to cartridges (i.e., computing components/IT equipment) in a blade enclosure. A blade enclosure is an enclosure for a computing system that can hold a plurality of cartridges. Each cartridge can function as a server, a storage unit, or any other specialized computer module.

Blank cartridges are often provided in enclosures as place holders for functional cartridges to be later installed, to achieve certain system configuration, etc. Thus blank cartridges, although they may look like and have the same size as a functional cartridge, do not function as a server, storage unit, or any other specialized computer module. Henceforth, functional cartridges will be referred to as computing components or IT equipment to differentiate from the blank cartridges.

Blank cartridges are designed with fixed impedance to only allow a predetermined amount of cooling media (e.g., air) to flow through them. Thus, if there are computing components in series with the blank cartridge, the speed of the fans will need to be increased in order to overcome the fixed impedance of the blank cartridge to provide more airflow to these computing components. Similarly, if there are computing components in parallel with the blank cartridge, the speed of the fans will need to be increased and accept the loss of airflow created from the fixed impedance of the blank cartridge in order to provide more airflow to these computing components. This fixed impedance solution increases the cooling power needed to cool computing components and leads to energy inefficiency.

The described examples address the above concerns by providing a solution to actively manage the impedance of blank cartridges in order to direct the cooling medium (e.g., air, water, etc.) more efficiently to where it is needed, resulting in lower cooling power and high energy efficiency, for example, due to reduced fan speed, reduced pump speed, and so on.

In one example, a blank cartridge includes an impedance portion to control a flow of cooling media through the blank cartridge to a plurality of computing components. The blank cartridge also includes an actuator to change an impedance level of the impedance portion. The actuator is to receive a control signal to change the impedance level of the impedance portion based on a location of the plurality of computing components relative to the blank cartridge.

In another example, a computing system for controlling impedance of blank cartridges includes an enclosure, a management controller, a plurality of computing components, and a plurality of blank cartridges disposed in the enclosure. The plurality of blank cartridges each include at least one impedance portion to control a flow of cooling media through the blank cartridge to the plurality of computing components, an actuator to change a position of the at least one impedance portion, and an electrical interface to connect the blank cartridge to the management controller. The management controller is to instruct the actuator to change the position of the at least one impedance portion based on a location of the plurality of computing components.

In another example, a method for controlling an impedance of a blank cartridge of a computing system includes providing a blank cartridge including an impedance portion and an actuator for changing a position of the impedance portion. The method includes determining a location of a computing component relative to the blank cartridge and changing the position of the impedance portion based on the location of the computing component.

Referring now to the figures, FIG. 1 illustrates an example of a blank cartridge including an impedance portion and an actuator to change an impedance level of the impedance portion. Blank cartridge 100 can be any blank device of a computing system such as a server cartridge blank, a processor blank, a dual in-line memory module (DIMM) or memory blank, a hard disk drive (HDD) blank, a power supply blank, a peripheral component interconnect (PCI) blank, a fan blank, an optical disc drive (ODD) blank, or any other type of computer module blank.

Blank cartridge 100 includes an impedance portion 102 to control the flow of cooling media through the blank cartridge 100. The impedance portion 102 can be, for example, a movable wall, door, valve, or any other impedance creating member to control the flow of cooling media across the blank cartridge 100. Although the impedance portion 102 is shown in FIG. 1 to be located at a middle portion of the blank cartridge 100, it should be noted that the impedance portion 102 can be located on any portion of the blank cartridge 100 (e.g., front or back). Further, in certain example, blank cartridge 100 can include more than one impedance portion 102.

Blank cartridge 100 also includes an actuator 104 to change an impedance level of the impedance portion 102. Actuator 104 can be, for example, a motor/rotor, a magnetic device, or any mechanical/electrical device to change the impedance level of the impedance portion 102. For example, the actuator 104 can change the impedance level of the impedance portion 102 by increasing/decreasing the angle and/or position of the impedance portion 102, thereby controlling the flow of cooling media through the blank cartridge 100. As shown in FIG. 1, the actuator 104 can lower or reduce the impedance level (or angle) of the impedance portion 102 to maximize the flow of the cooling medium through the blank cartridge 100. Accordingly, the impedance of the blank cartridge 100 is minimized to maximize flow as indicated by the flow direction arrows.

Blank cartridge 100 includes an electrical interface 106 to connect the blank cartridge 100 to a management controller (not shown) external to the blank cartridge. The electrical interface 106 can be, for example, one or more electrical pins, a PCI-express card connector, or any other connector to connect the blank cartridge 100 to the management controller. Further, electrical interface 106 can be a bi-directional interface through which the blank cartridge 100 can exchange communications with the management controller. Thus, the electrical interface 106 can receive power and control signal from the management controller. In some examples, the power and control signal can be sent/transmitted wirelessly from the management controller.

The management controller is a component in a computing system (e.g., blade enclosure) that monitors, directs and controls various components of the computing system. For example, the management controller can be responsible for monitoring the temperature in the blade enclosure, controlling a cooling system in the blade enclosure, managing remote logging, and sending alerts within the computing system. Further, the management controller can detect the presence of a computing component or the blank cartridge 100 and determine the locations of the computing components and blank cartridge.

Accordingly, the management controller can instruct the actuator 104 of the blank cartridge to change the impedance level of the impedance portion 102 based on the location of the plurality of computing components relative to the blank cartridge 100. For example, when the computing components are located in series with the blank cartridge, the actuator 104 is instructed to minimize the impedance level of the impedance portion 102 to maximize the flow of cooling media through the blank cartridge 100 to the plurality of computing components. In another example, when the computing components are located in parallel with the blank cartridge 100, the actuator 104 is instructed to maximize the impedance level of the impedance portion 102 to maximize the flow of cooling media to the plurality of computing devices in parallel with the blank cartridge 100. In certain examples, the impedance level of the impedance portion 102 can be changed based on at least one of the location of the plurality of computing components, the ambient temperature of the computing system (or the enclosure), the configuration of the enclosure, and individual temperatures of the plurality of computing components.

Figure 2:
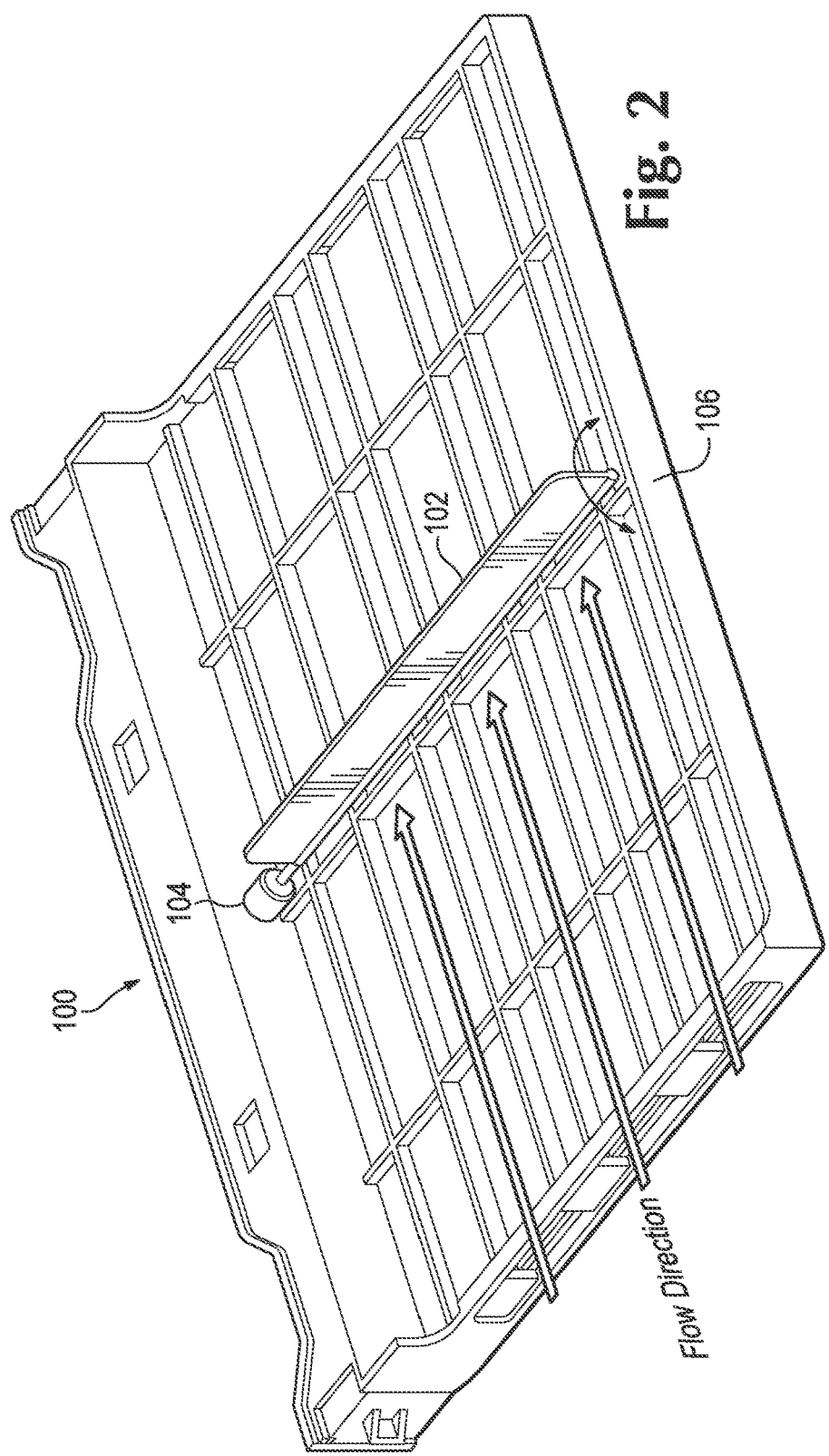
FIG. 2 illustrates another example of a blank cartridge including an impedance portion and an actuator to change an impedance level of the impedance portion.

FIG. 2 illustrates another example of a blank cartridge including an impedance portion and an actuator to change an impedance level of the impedance portion. The blank cartridge 100 includes the impedance portion 102, the actuator 104, and the electrical interface 106.

In the example of FIG. 2, the impedance level of the impedance portion 102 is maximized to provide a greater resistance to the flow of the cooling medium through the blank cartridge 100, as illustrated in the flow direction arrows. In this example, it may be desirable to maximize the impedance of the blank cartridge 100 in order to maximize the flow of cooling medium to components that are in parallel with the blank cartridge 100.

Thus, the impedance level of the blank cartridge 100 can be actively or dynamically changed based on one or more conditions including the location of the plurality of computing components, ambient temperature of the system/enclosure, individual temperature of the computing components, and system configuration. By actively managing the impedance of the blank cartridge 100, the described solution provides improved energy efficiency by reducing cooling power consumption (and overall system power consumption).

Figure 3:
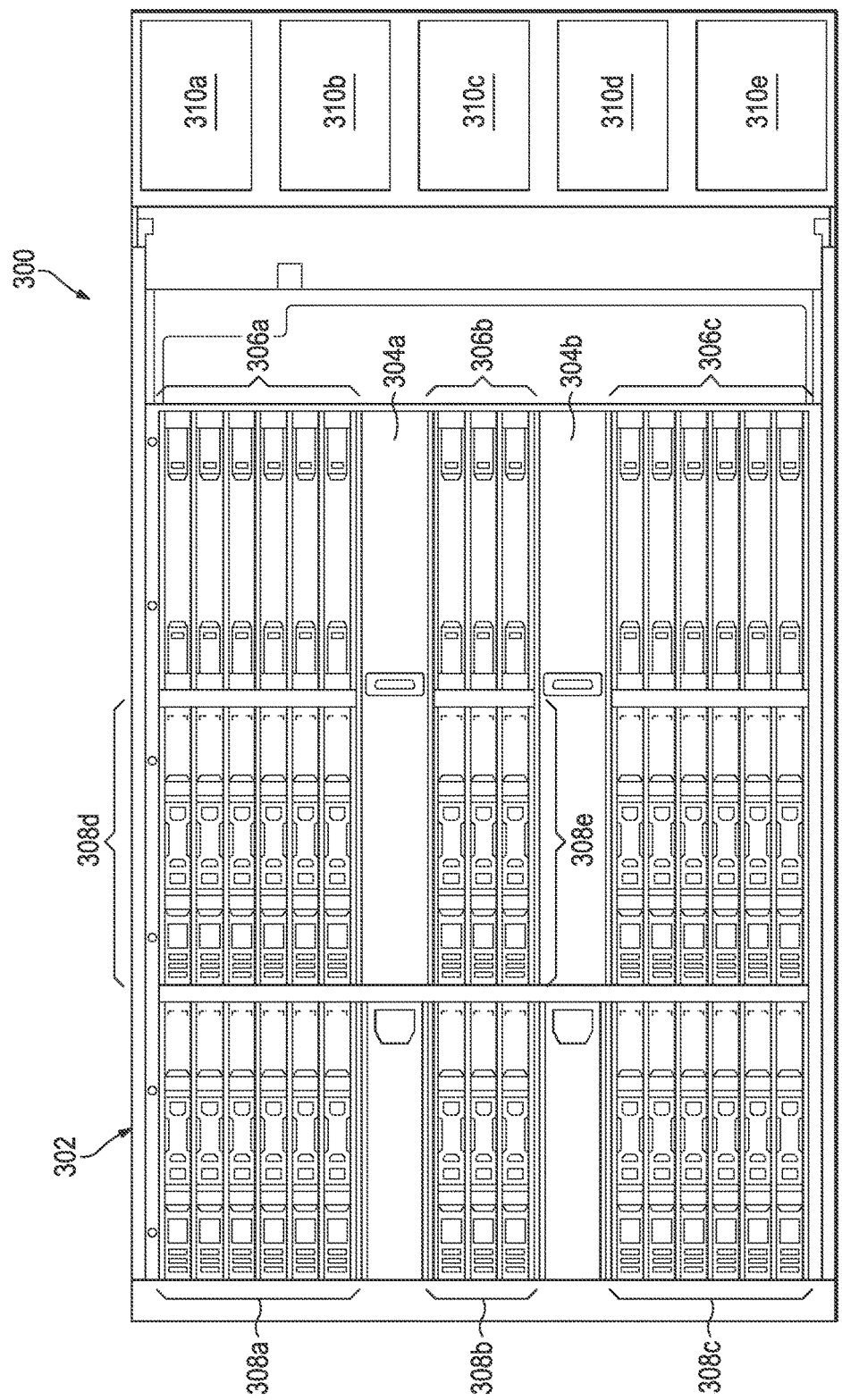
FIG. 3 illustrates an example of a computing system comprising an enclosure including at least one blank cartridge and a plurality of computing components.

FIG. 3 illustrates an example of a computing system comprising an enclosure including at least one blank cartridge and a plurality of computing components. Computing system 300 includes an enclosure 302 that includes a plurality of computing components 308a-308f, a plurality of blank cartridges 306a-306c, switches 304a-304b, and a plurality of cooling medium flow control devices 310a-310e.

Enclosure 302 can be, for example, a multi-slot blade enclosure that can hold the multiple computing components 308, blank cartridges 306, switches 304, and cooling devices 310. Enclosure 302 can include a backplane (not shown) that can function as a backbone, providing a means of communication between the plurality of devices in the enclosure 302, a management controller (not shown), and an external network (not shown). Each component can include an electrical interface (including an e-fuse component) to communicate with the management controller and that can be used to deliver a specific amount of power from the backplane of the enclosure 302 to the components.

Switches 304a and 304b can couple the computing components 308 and the blank cartridges 306 to the external network, which can be a wired or wireless network that includes any number of computers, storage drive bays, or any connected electronic devices. Switches 304a-304b can control the routing in the computing system 300 (e.g., forward and receive data to and from the computing components 308 and the blank cartridges 306).

Cooling devices 310a-310e can be, for example, a fan module, a pump, a piezoelectric device, or any other device to direct the cooling media (e.g., air, liquid, chemicals, and gas) in the enclosure 302.

In the example of FIG. 3, blank cartridges 306a-306c can be actuated to provide minimal impedance to the flow of cooling media, because they are in series with computing components 308a-308f. Accordingly, the flow of cooling media (e.g., from left to right) to the computing components 308a-308f is maximized.

Figure 4:
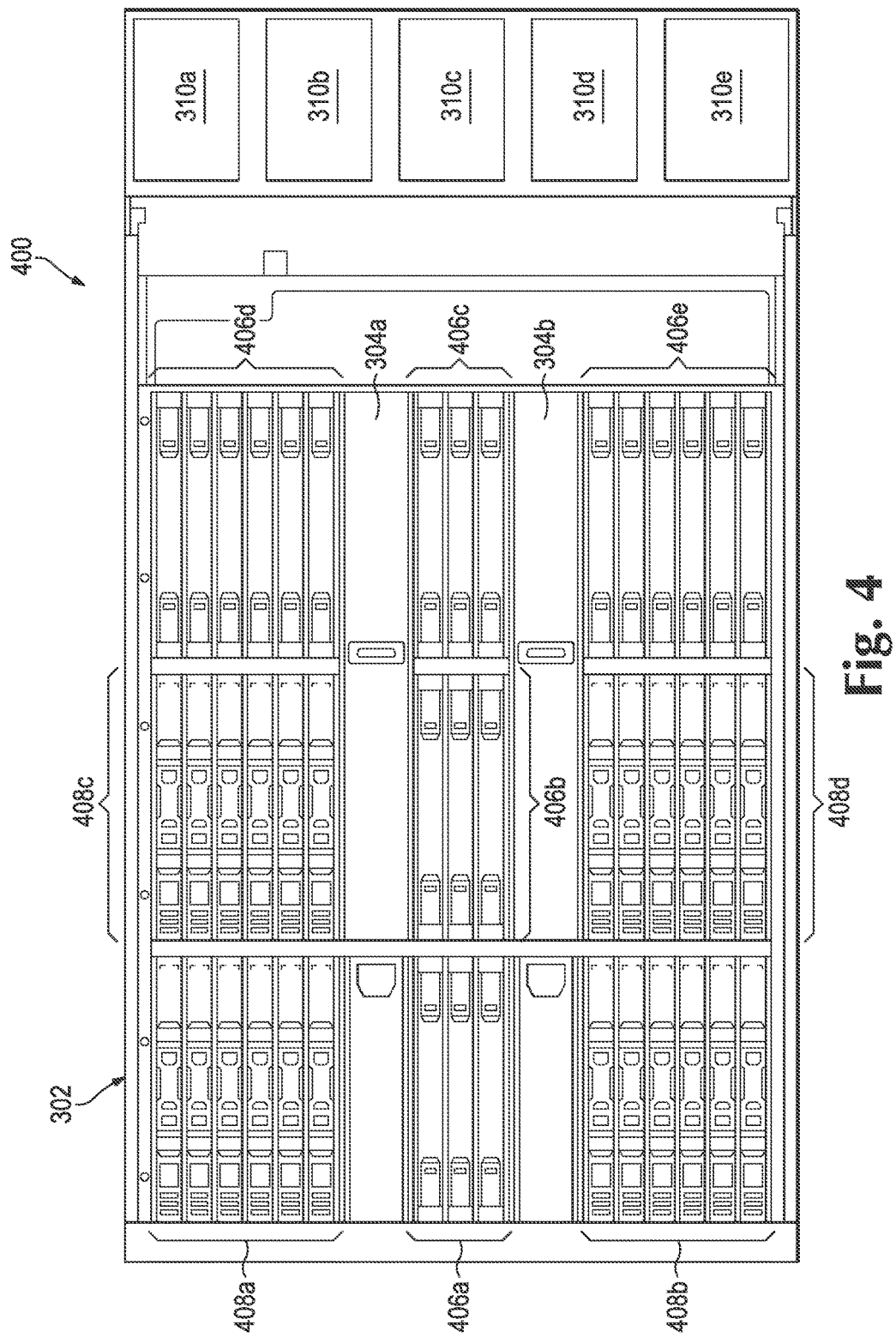
FIG. 4 illustrates another example of a computing system comprising an enclosure including at least one blank cartridge and a plurality of computing components.

FIG. 4 illustrates another example of a computing system comprising an enclosure including at least one blank cartridge and a plurality of computing components. Computing system 400 includes the enclosure 302 that houses a plurality of computing components 408a-408d, a plurality of blank cartridges 406a-406e, switches 304a-304b, and cooling devices 310a-310e. It should be noted that the configuration (i.e., location of devices) of the enclosure 302 in FIG. 4 is different than the configuration of the enclosure 302 of FIG. 3

In the example of FIG. 4, blank cartridges 406a-406c can be actuated to provide maximum impedance to the flow of cooling media, because these blank cartridges are in parallel with computing components 408a-408d. Accordingly, the flow of cooling media (e.g., from left to right) to the computing components 408a-408d is maximized.

Figure 5:
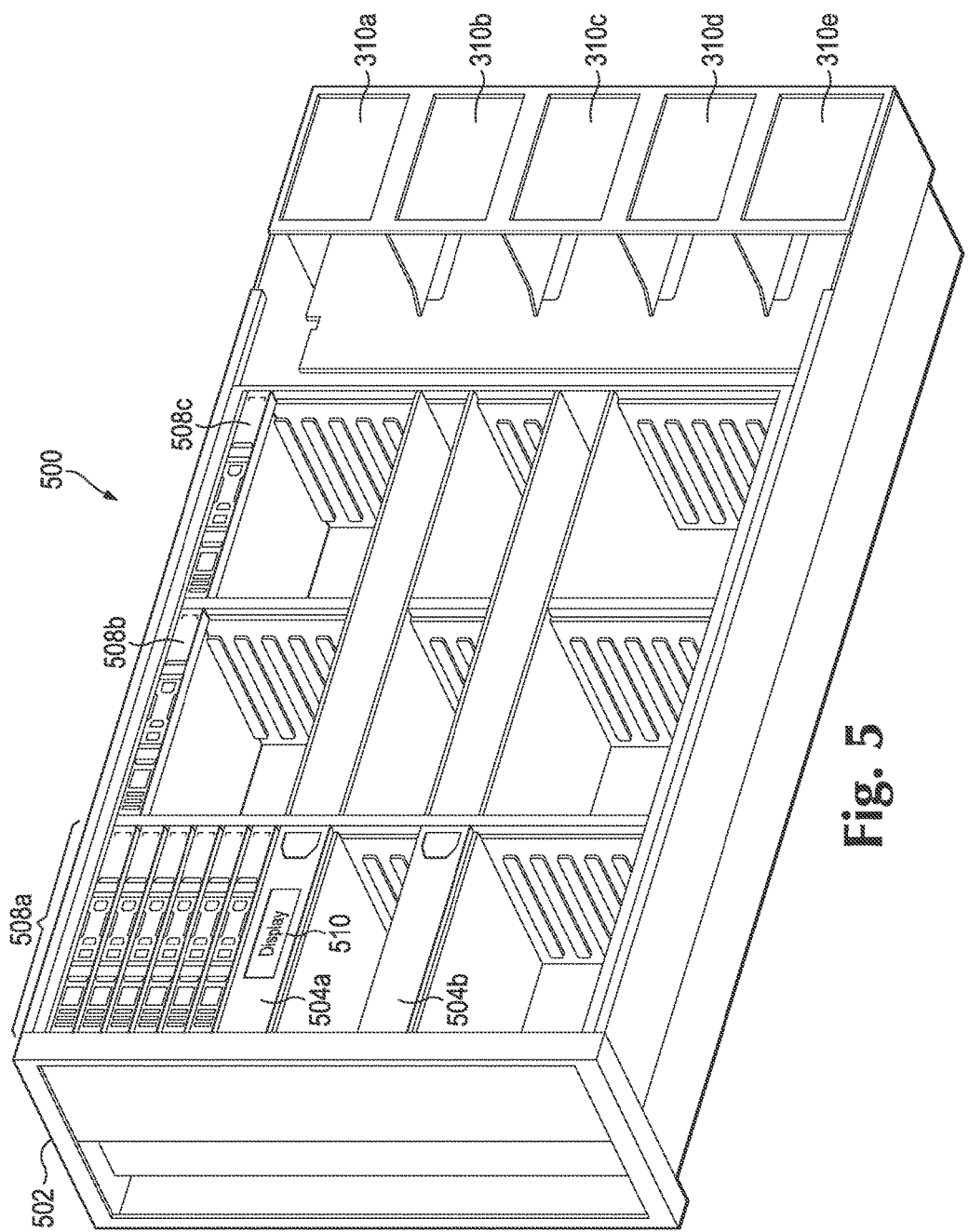
FIG. 5 illustrates another example of a computing system comprising an enclosure including at least one blank cartridge and a plurality of computing components.

FIG. 5 illustrates another example of a computing system comprising an enclosure including at least one blank cartridge and a plurality of computing components. Computing system 500 includes enclosure 502 that houses a plurality of computing components 508a-508c, blank cartridges 504a-504b, and cooling devices 310a-310e.

In the example of FIG. 5, blank cartridges 504 can include a display portion 510. The display portion 510 can provide information such as whether the blank cartridge 504 is connected to the enclosure 502, and other conditions or status of the blank cartridge 504, such as impedance levels, etc. In some examples, the display portion may include light emitting diodes (LEDs). It should be noted that computing components 508a-508c can similarly include a display portion.

Figure 6:
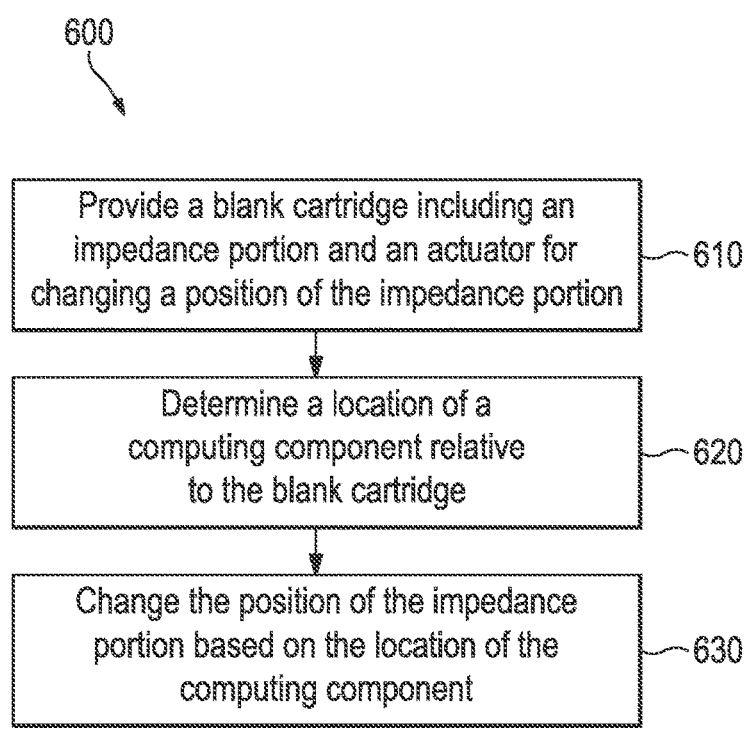
FIG. 6 is an example of a flowchart illustrating a method for controlling an impedance of a blank cartridge in a computing system.

FIG. 6 is an example of a flowchart illustrating a method for controlling an impedance of a blank cartridge in a computing system. Method 600 may be implemented, for example, in the form of executable instructions stored on a non-transitory computer-readable storage medium and/or in the form of electronic circuitry.

Method 600 includes providing a blank cartridge including an impedance portion and an actuator for changing a position of the impedance portion, at 610. For example, blank cartridge 100 can include an impedance portion 102 and an actuator 104 for changing a position (i.e., the impedance level) of the impedance portion 102.

Method 600 includes determining a location of a computing component relative to the blank cartridge, at 620. For example, when one or more computing components are added to an enclosure of the computing system, the location of the computing components and the location of the blank cartridge on the enclosure can be determined (e.g., via the electrical interface that connects computing components and blank cartridge to the enclosure).

Method 600 also includes changing the position of the impedance portion based on the location of the computing component, at 630. For example, the actuator 104 can change the impedance portion position of the blank cartridge based on the location of the computing component. In some examples, method 600 of FIG. 6 includes additional steps in addition to and/or in lieu of those depicted in FIG. 6.

Figure 7:
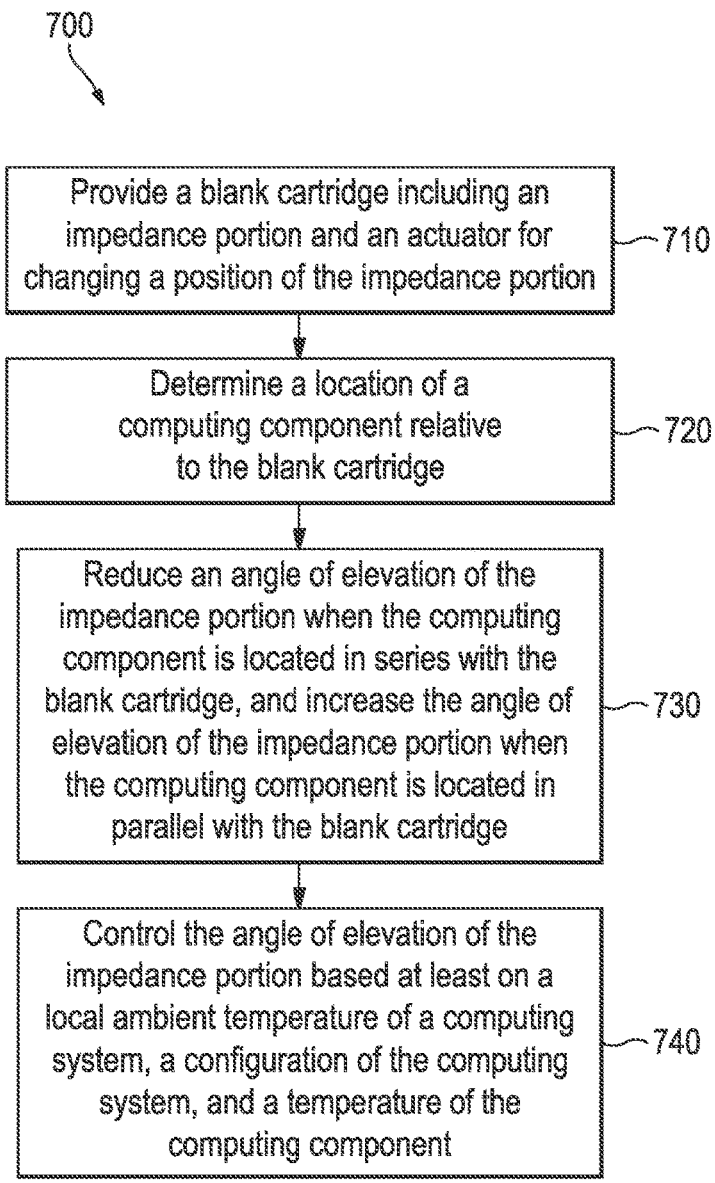
FIG. 7 is another example of a flowchart illustrating a method for controlling an impedance of a blank cartridge in a computing system.

FIG. 7 is another example of a flowchart illustrating a method for controlling an impedance of a blank cartridge in a computing system. Method 700 may be implemented, for example, in the form of executable instructions stored on a non-transitory computer-readable storage medium and/or in the form of electronic circuitry.

Method 700 includes providing a blank cartridge including an impedance portion and an actuator for changing a position of the impedance portion, at 710, and determining a location of a computing component relative to the blank cartridge, at 720.

Method 700 includes reducing an angle of elevation of the impedance portion when the computing component is located in series with the blank cartridge, and increasing the angle of elevation of the impedance portion when the computing component is located in parallel with the blank cartridge, at 730. For example, the actuator 104 can reduce the reduce/decrease or increase the angle of elevation of the impedance portion 102 to maximize the flow of cooling media to the computing component, based on the location of the computing component relative to the blank cartridge 100.

Method 700 also includes controlling the angle of elevation of the impedance portion based at least on a local ambient temperature of a computing system, a configuration of the computing system, and a temperature of the computing component, at 740. For example, actuator 140 can receive control signals/instructions from a management controller to change the angle of elevation of the impedance portion 102 (i.e., increase or decrease) based on ambient temperature of the system, the configuration of the system, temperature of the computing component, or any combination thereof. In some examples, method 700 of FIG. 7 includes additional steps in addition to and/or in lieu of those depicted in FIG. 7.

The techniques described above may be embodied in a computer-readable medium for configuring a computing system to execute the method. The computer-readable media may include, for example and without limitation, any number of the following non-transitive mediums: magnetic storage media including disk and tape storage media; optical storage media such as compact disk media (e.g., CD-ROM. CD-R, etc.) and digital video disk storage media; holographic memory; nonvolatile memory storage media including semiconductor-based memory units such as FLASH memory, EEPROM. EPROM, ROM; ferromagnetic digital memories; volatile storage media including registers, buffers or caches, main memory, RAM, etc.; and the Internet, just to name a few. Other new and obvious types of computer-readable media may be used to store the software modules discussed herein. Computing systems may be found in many forms including but not limited to mainframes, minicomputers, servers, workstations, personal computers, notepads, personal digital assistants, tablets, smartphones, various wireless devices and embedded systems, just to name a few.

In the foregoing description, numerous details are set forth to provide an understanding of the present disclosure. However, it will be understood by those skilled in the art that the present disclosure may be practiced without these details. While the present disclosure has been disclosed with respect to a limited number of examples, those skilled in the art will appreciate numerous modifications and variations therefrom. It is intended that the appended claims cover such modifications and variations as fall within the true spirit and scope of the present disclosure.

What is claimed is:

1. A blank cartridge insertable into a slot of a plurality of slots of the computing system, comprising:
   an impedance portion to control how cooling media flows through the blank cartridge and thereby control how the cooling media flows to a plurality of functional, non-blank cartridges having computing components and inserted into other slots of the plurality of slots of the computing system; and
   an actuator to change an impedance level of the impedance portion,
   wherein the actuator is to receive a control signal to change the impedance level of the impedance portion based on a location of the functional, non-blank cartridges relative to the blank cartridge within the computing system.

2. The blank cartridge of claim 1,
wherein when the functional, non-blank cartridges are located in series with the blank cartridge within the computing system, the actuator is to minimize the impedance level of the impedance portion to maximize the flow of cooling media through the blank cartridge to the functional, non-blank cartridges, and
wherein when the functional, non-blank cartridges are located in parallel with the blank cartridge within the computing system, the actuator is to maximize the impedance level of the impedance portion to maximize the flow of cooling media to the functional, non-blank cartridges in parallel with the blank cartridge.

3. The blank cartridge of claim 1, wherein the cooling media includes at least one of air, liquid, gas, or chemical compounds.

4. The blank cartridge of claim 1, wherein the impedance portion includes at least one of a movable wall, a door, or a valve to control the flow of cooling media through the blank cartridge to the functional, non-blank cartridges, and wherein the actuator includes at least one of a motor or a magnetic device.

5. The blank cartridge of claim 1, further comprising an electrical interface to connect the blank cartridge to an enclosure of the computing system.

6. The blank cartridge of claim 5,
wherein the electrical interface is to receive a power signal and the control signal from a management controller external to the blank cartridge.

7. The blank cartridge of claim 6,
wherein the management controller is to provide the control signal to the blank cartridge via the electrical interface to instruct the actuator to change the impedance level of the impedance portion further based on at least one of an ambient temperature of the enclosure, a configuration of the enclosure, or a temperature of the functional, non-blank cartridges.

8. A computing system comprising:
an enclosure having a plurality of slots;
a management controller;
a plurality of functional, non-blank cartridges inserted into some of the slots of the enclosure, the functional, non-blank cartridges including computing components; and
a plurality of blank cartridges inserted into others of the slots of the enclosure, each of the blank cartridges comprising:
an impedance portion to control how cooling media flows through one of the plurality of blank cartridges that contains the impedance portion and thereby control how the cooling media flows to the functional, non-blank cartridges;
an actuator to change a position of the impedance portion; and
an electrical interface to connect to the management controller,
wherein the management controller is to instruct the actuator of each of the blank cartridges to change the position of the impedance portion based on a location of the one of the blank cartridges that contains the impedance portion relative to the functional, non-blank cartridges within the enclosure.

9. The computing system of claim 8,
wherein the management controller is to instruct the actuator to control the position of the impedance portion based on at least one of a local ambient temperature of the computing system, a configuration of the computing system, or individual temperatures of the functional, non-blank cartridges.

10. The computing system of claim 8,
wherein the management controller is to provide a power signal and a control signal to the actuator to control a position of the impedance portion, wherein the position includes an angle of elevation of the impedance portion.

11. The computing system of claim 10,
wherein the management controller is to instruct the actuator to:
reduce the angle of elevation of at least one wall to increase the flow of cooling medium to the functional, non-blank cartridges that are in series with the plurality of blank cartridges within the enclosure; and
increase the angle of elevation of the at least one wall to increase the flow of cooling medium to the functional, non-blank cartridges that are in parallel to the plurality of blank cartridges within the enclosure.

12. The computing system of claim 8, further comprising a medium flow control device to direct the cooling medium to the blank cartridges and to the functional, non-blank cartridges, wherein the medium flow control device includes at least one of a pump, a fan, or a piezoelectric component.

13. A method comprising:
providing the blank cartridge inserted into a slot of a plurality of slots of a computing system and comprising an impedance portion and an actuator for changing a position of the impedance portion;
determining a location of a functional, non-blank cartridge including a computing component and inserted into another slot of the plurality of slots of the computing system, relative to the blank cartridge, within the computing system; and
changing the position of the impedance portion based on the location of the functional, non-blank cartridge relative to the blank cartridge within the computing system.

14. The method of claim 13, wherein the position of the impedance portion includes an angle of elevation of the impedance portion, the method comprising:
reducing the angle of elevation of the impedance portion when the functional, non-blank cartridge is located in series with the blank cartridge within the computing system; and
increasing the angle of elevation of the impedance portion when the functional, non-blank cartridge is located in parallel with the blank cartridge within the computing system.

15. The method of claim 13, further comprising changing the position of the impedance portion based on at least one of a local ambient temperature of the computing system, a configuration of the computing system, or a temperature of the functional, non-blank cartridge.

* * * * *